(12) United States Patent
Otsuka

(10) Patent No.: US 10,027,522 B2
(45) Date of Patent: Jul. 17, 2018

(54) TRANSMISSION SYSTEM

(71) Applicant: Kabushiki Kaisha Toshiba, Minato-ku, Tokyo (JP)

(72) Inventor: Kuniaki Otsuka, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/406,365

(22) Filed: Jan. 13, 2017

(65) Prior Publication Data

US 2017/0237595 A1 Aug. 17, 2017

(30) Foreign Application Priority Data

Feb. 15, 2016 (JP) .................................. 2016-026059

(51) Int. Cl.
| | |
|---|---|
| *H04L 27/36* | (2006.01) |
| *H04L 27/26* | (2006.01) |
| *G06F 11/20* | (2006.01) |
| *H04B 1/74* | (2006.01) |
| *H04L 1/22* | (2006.01) |
| *H03F 1/52* | (2006.01) |
| *H03F 3/72* | (2006.01) |

(52) U.S. Cl.
CPC .......... *H04L 27/2626* (2013.01); *G06F 11/20* (2013.01); *H03F 1/526* (2013.01); *H03F 3/72* (2013.01); *H04B 1/74* (2013.01); *H04L 1/22* (2013.01); *H03F 2203/7236* (2013.01); *H04L 27/367* (2013.01)

(58) Field of Classification Search
CPC ............. H04L 27/2601; H04L 27/2626; H04L 27/2627

USPC ......................................... 375/295, 296, 297
See application file for complete search history.

(56) References Cited

U.S. PATENT DOCUMENTS

| | | | | |
|---|---|---|---|---|
| 6,259,693 B1 * | 7/2001 | Ganmukhi | ............ | H04L 49/255 370/366 |
| 6,614,760 B1 * | 9/2003 | Suzuki | ................ | H04L 12/5601 370/244 |
| 2003/0128979 A1 * | 7/2003 | Kitajima | ............ | H04B 10/0793 398/12 |
| 2012/0250739 A1 * | 10/2012 | Nagaki | ................... | H04J 3/085 375/219 |

(Continued)

FOREIGN PATENT DOCUMENTS

| | | |
|---|---|---|
| JP | H10-224430 A | 8/1998 |
| JP | H10-290206 A | 10/1998 |

*Primary Examiner* — Siu Lee
(74) *Attorney, Agent, or Firm* — Knobbe, Martens, Olson & Bear, LLP

(57) ABSTRACT

According to one embodiment, a transmission system may include a plurality of signal processing apparatuses. The signal processing apparatus are connected in series. The signal processing apparatus includes a plurality of signal processors, and a switcher. The signal processors generate an output signal by performing signal processing of an input signal from an earlier-stage signal processing apparatus. The signal processors supply the output signal into which is included an abnormality signal if the input signal does not include the abnormality signal and also the output signal does not satisfy the criteria. The switcher receives a plurality of output signals output from the plurality of signal processors. The switcher supplies an output signal of the plurality of output signals.

2 Claims, 7 Drawing Sheets

(56) References Cited

U.S. PATENT DOCUMENTS

2015/0189340 A1* 7/2015 Matsushita ........... G06F 9/4401
                                                    725/116
2017/0038984 A1* 2/2017 Manabe ................ G06F 3/0619
2017/0090946 A1* 3/2017 Matsushita ........... G06F 9/4406

* cited by examiner

TRANSMISSION SYSTEM

CROSS-REFERENCE TO RELATED APPLICATION

This application is based upon claims the benefit of priority from Japanese Patent Application No. 2016-026059 filed Feb. 15, 2016; the entire contents of which are incorporated herein by reference.

FIELD

Embodiments describe herein relate generally to a transmission system.

BACKGROUND

Broadcast transmission systems and the like that require high reliability establish redundancy by providing a plurality of active systems and backup systems. In such systems, switchable apparatuses combine active devices and backup devices with switchers in series connection. If there is a causal relationship with respect to an abnormality in a device in an earlier-stage apparatus and an abnormality in a device in a later-stage apparatus, an abnormality occurring in the earlier-stage apparatus is detected not only by the earlier-stage apparatus but also by the later-stage apparatus. If an abnormality occurs in the earlier-stage apparatus, the abnormality is also detected in the later-stage apparatus until the switching of devices in the earlier-stage apparatus is completed.

If an abnormality is detected in the later-stage apparatus due to the abnormality of an earlier-stage apparatus, switching the device in the later-stage apparatus can not resolve the abnormality in the later-stage apparatus, it is necessary to wait for the switching of the device in the earlier-stage apparatus. That is, if an abnormality is detected in a later-stage apparatus, after confirming that the abnormality occurring in an earlier-stage apparatus is not the cause, it is necessary to switch the device in the later-stage apparatus. There are methods for avoiding unnecessary switching of the device in the later-stage apparatus. As an example of the methods, if the abnormality is detected in the later-stage apparatus, after a waiting time has elapsed, the devices are switched based on whether or not an abnormality exists in the later-stage apparatus. The waiting time is a time required for switching the devices in the earlier-stage apparatus In the above-described method, however, if the abnormality occurs in the later-stage apparatus, because the switching of the device has not been done until the waiting time has elapsed, a state might be continuously occurred in which the abnormality has occurred. Additionally, in the system in which a number of devices are serially connected, if the abnormality occurs in a later-stage apparatus, it means that a state of the abnormality continues for a long time so that the operation of the system might be hindered.

DETAILED DESCRIPTION

According to one embodiment, a transmission system may include, but is not limited to, a plurality of signal processing apparatuses. The signal processing apparatus are connected in series. The signal processing apparatus may include, but is not limited to, a plurality of signal processors, and a switcher. The signal processors generate an output signal by performing signal processing of an input signal from an earlier-stage signal processing apparatus. The signal processors supply the output signal in two cases; one case is if an abnormality signal indicating that criteria in the earlier-stage signal processing apparatus is not satisfied is included in the input signal, and another case is if the abnormality signal is not included in the input signal and also the output signal satisfies the criteria in the local device. The signal processors supply the output signal into which is included an abnormality signal if the abnormality signal is not included in the input signal and also the output signal does not satisfy the criteria. The switcher receives a plurality of output signals output from the plurality of signal processors. The switcher supplies an output signal of the plurality of output signals if the output signal for the later-stage signal processing apparatus satisfies the criteria and if the abnormality signal is included in the input signal. The switcher supplies another output signal of the plurality of output signals if the output signal for the later-stage signal processing apparatus does not satisfy the criteria and also the abnormality signal is not included in the input signal.

Embodiments

Figure 1:
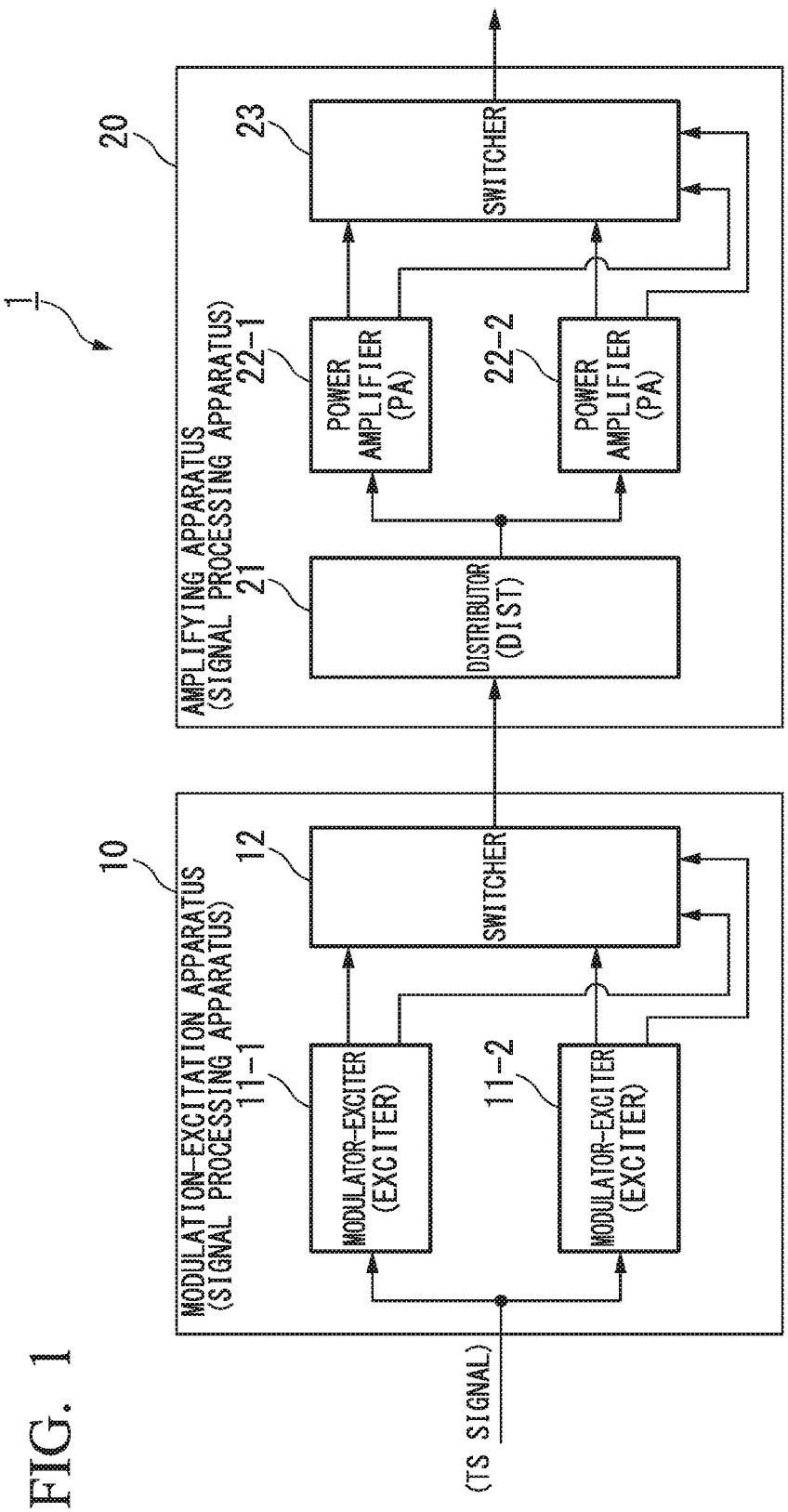
FIG. 1 is a block diagram showing an example of the configuration of a transmission system according to the present embodiment.

A transmission system according to embodiments will be described below, with references being made to drawings. FIG. 1 is a block diagram showing an example of the configuration of a transmission system 1 according to the present embodiment. The transmission system 1 receives a transport stream (TS) signal and transmits an OFDM signal generated from the TS signal. The transmission system 1 has a modulation-excitation apparatus 10 and amplifying apparatus 20. The modulation-excitation apparatus 10 receives a TS signal to be transmitted and generates and supplies a UHF-band OFDM signal. The amplifying apparatus 20 receives the UHF-band OFDM signal output from the modulation-excitation apparatus 10, and amplifies the UHF-band OFDM signal to generate an amplified UHF-band OFDM signal. The amplified UHF-band OFDM signal output from the amplifying apparatus 20 is radiated from an antenna element (not shown). The modulation-excitation apparatus 10 has two modulator-exciters 11 (11-1 and 11-2) and a switcher 12. The amplifying apparatus 20 has a distributor 21, two power amplifiers 22 (22-1 and 22-2) and a switcher 23.

Figure 2:
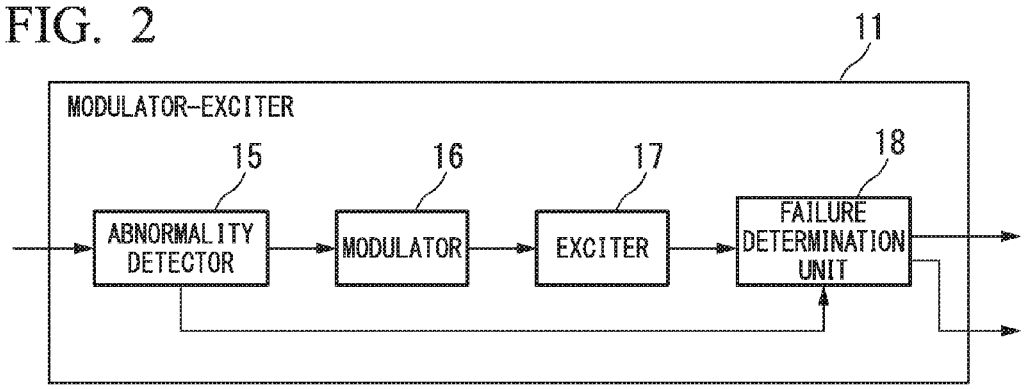
FIG. 2 is a block diagram showing an example of the configuration of a modulator-exciter according to the present embodiment.

FIG. 2 is a block diagram showing an example of the configuration of the modulator-exciter 11 according to the present embodiment. The modulator-exciter 11 has an abnormality detector 15, a modulator 16, an exciter 17, and a failure determination unit 18. The abnormality detector 15 receives a TS signal as a signal to be transmitted. The abnormality detector 15 determines whether or not a first abnormality signal is included in the TS signal, wherein the first abnormality signal shows that the TS signal does not satisfy prescribed criteria. The abnormality detector 15 notifies to the failure determination unit 18 the detection results of whether or not the first abnormality signal is detected in the TS signal. The abnormality detector 15 supplies the input TS signal to the modulator 16.

The modulator 16 receives the TS signal and modulates the TS signal to an OFDM signal in the IF (intermediate frequency) band in conformance with a prescribed broadcast system standard. The prescribed broadcast system is, for example, ISDB-T (Integrated Services Digital Broadcasting for Terrestrial television broadcasting) system. The modulator 16 supplies the exciter 17 with the OFDM signal in the IF band. The exciter 17 performs pre-distortion with respect to the IF-band OFDM signal in order to compensate for non-linear distortion occurring in the amplifying apparatus 20 of the later stage. Then, the exciter 17 shifts the frequency of the pre-distorted OFDM signal to the UHF band frequency as the transmission frequency band. The exciter 17 supplies the UHF-band OFDM signal to the failure determination unit 18.

The failure determination unit 18 determines whether or not the UHF-band OFDM signal conforms to the broadcast system standard. That is, the failure determination unit 18 determines whether or not the UHF-band OFDM signal satisfies the criteria or specification prescribed by the broadcast system standard. The failure determination unit 18 supplies the UHF-band OFDM signal to the switcher 12 in two cases; one case is when the 10 abnormality detector 15 detects the first abnormality signal from the TS signal, and another case is when the abnormality detector 15 does not detect the first abnormality from the TS signal and also the UHF-band OFDM signal satisfies the criteria. The failure determination unit 18 incorporates a second abnormality signal into the UHF-band OFDM signal when the abnormality detector 15 does not detect the first abnormality signal from the TS signal and also the UHF-band OFDM signal does not satisfy the criteria. The second abnormality signal indicates that the UHF-band OFDM signal does not satisfy the criteria or specification. The failure determination unit 18 supplies the UHF-band OFDM signal, into which the second abnormality signal is incorporated, when the abnormality detector 15 does not detect the first abnormality signal from the TS signal and also the UHF-band OFDM signal does not satisfy the criteria.

The failure determination unit 18 supplies the switcher 12 with a normal signal indicating that an abnormality does not occur in the modulator-exciter 11 in two cases; one case is when the abnormality detector 15 detects the first abnormality signal from the TS signal, and another case is when the abnormality detector 15 does not detect the first abnormality signal from the TS 25 signal and also the UHF-band OFDM signal satisfies the criteria. The failure determination unit 18 supplies the switcher 12 with an alarm signal indicating that an abnormality occurs in the modulator-exciter 11 when the abnormality detector 15 does not detect the first abnormality signal from the TS signal and also the UHF-band OFDM signal does not satisfy the criteria.

Referring back to FIG. 1, the description of the modulation-excitation apparatus 10 will be continued. The switcher 12 receives signals from each of the two modulator-exciters 11-1 and 11-2, wherein the signals are the UHF-band OFDM signal and a signal (normal signal or alarm signal) indicating whether or not an abnormality occurs in the two modulator-exciters 11-1 and 11-2. The switcher 12 selects one of the two modulator-exciters 11-1 and 11-2. The switcher 12 supplies the amplifying apparatus 20 with the UHF-band OFDM signal output by the modulator-exciter 11 currently selected. When the alarm signal is output from the modulator-exciter 11 selected, the switcher 12 selects another modulator-exciter 11 and supplies the UHF-band OFDM signal output from the modulator-exciter 11 newly selected to the amplifying apparatus 20.

For example, when the switcher 12 has selected the modulator-exciter 11-1 as the active system, when the alarm signal is output from the modulator-exciter 11-1, the switcher 12 performs switching processing. The switching processing includes selecting the modulator-exciter 11-2, which is the backup system and supplying the UHF-band OFDM signal from the modulator-exciter 11-2 to the amplifying apparatus 20.

In the amplifying apparatus 20, the distributor 21 receives the UHF-band OFDM signal output from the modulation-excitation apparatus 10 and supplies the UHF-band OFDM signal to each of two power amplifiers 22 (22-1 and 22-2).

Figure 3:
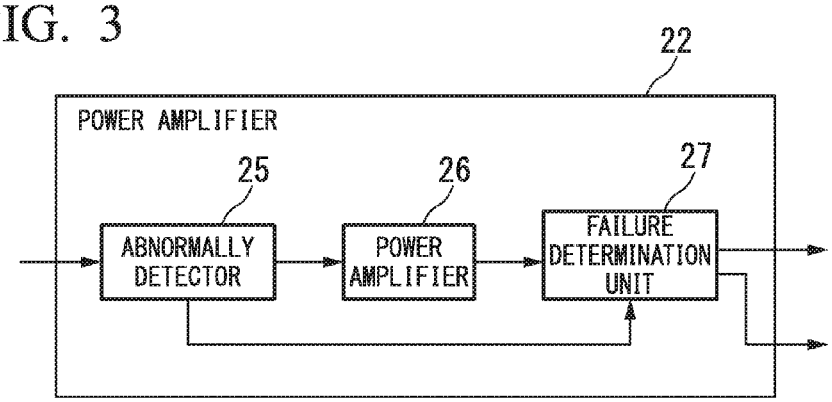
FIG. 3 is a block diagram showing an example of the configuration of a power amplifier according to the present embodiment.

FIG. 3 is a block diagram showing an example of the configuration of a power amplifier 22 according to the present embodiment. The power amplifier 22 has an abnormality detector 25, an amplifier 26, and a failure determination unit 27. The abnormality detector 25 determines whether or not a second abnormality signal is included in the UHF-band OFDM signal input from the modulation-excitation apparatus 10. The abnormality detector 25 notifies to the failure determination unit 27 of the detection results of whether or not the second abnormality signal is detected from the UHF-band OFDM signal. The abnormality detector 25 supplies the UHF-band OFDM signal to the amplifier 26.

The amplifier 26 amplifies the UHF-band OFDM signal input from the abnormality detector 25 to generate an amplified UHF-band OFDM signal and supplies the failure determination unit 27 with the amplified UHF-band OFDM signal. A plurality of amplifiers 26 may be provided for each prescribed power level. If a plurality of amplifiers 26 are provided in the power amplifier 22, depending to the power level to be output, any one of a plurality of the amplifiers 26 is selected or a plurality of the amplifiers 26 are selected and signals output from each of the amplifiers 26 are synthesized.

The failure determination unit 27 determines whether or not the amplified UHF-band OFDM signals that are output from the amplifiers 26 conform to the broadcast system standard. That is, a failure determination unit 27 determines whether or not the amplified UHF-band OFDM signal satisfies the criteria or specification prescribed by the broadcast system standard. The failure determination unit 27 supplies the amplified UHF-band OFDM signal to the switcher 23 when the abnormality detector 25 detects the second abnormality signal from the UHF-band OFDM signal and when the abnormality detector 25 does not detect the second abnormality signal from the UHF-band OFDM signal and also the amplified UHF-band OFDM signal satisfies the criteria. The failure determination unit 27 incorporates a third abnormality signal into the amplified UHF-band OFDM signal when the abnormality detector 25 does not detect the second abnormality signal from the UHF-band OFDM signal and also the amplified UHF-band OFDM signal does not satisfy the criteria or specification. The third abnormality signal indicates that the amplified UHF-band OFDM signal does not satisfy the criteria or specification. The failure determination unit 27 supplies the amplified UHF-band OFDM signal, into which the third abnormality signal is incorporated, when the abnormality detector 25 does not detect the second abnormality signal from the UHF-band OFDM signal and also the amplified UHF-band OFDM signal does not satisfy the criteria or specification.

The failure determination unit 27 supplies the switcher 23 with a normal signal indicating that an abnormality does not occur in the power amplifier 22 when the abnormality detector 25 detects the second abnormality signal from the UHF-band OFDM signal before amplification and when the abnormality detector 25 does not detect the second abnormality signal from the UHF-band OFDM signal and also the amplified UHF-band OFDM signal satisfies the criteria. The failure determination unit 27 supplies the switcher 23 with an alarm signal indicating that an abnormality occurs in the power amplifier 22 when the abnormality detector 25 does not detect the second abnormality signal from the UHF-band OFDM signal before amplification and also the amplified UHF-band OFDM signal does not satisfy the criteria.

Referring back to FIG. 1, the description of the amplifying apparatus 20 will be continued. The switcher 23 receives signals from each of two power amplifiers 22-1 and 22-2, wherein the signals are a signal (normal signal or alarm signal) indicating whether or not an abnormality occurs from each of two power amplifiers 22-1 and 22-2 and the amplified UHF-band OFDM signal that has been amplified to the prescribed power level. The switcher 23 selects one of the two power amplifiers 22-1 and 22-2. The switcher 23 supplies an antenna element with the amplified UHF-band OFDM signal output by the power amplifier 22 currently selected, so as to radiate the amplified UHF-band OFDM signal from the antenna element as a wireless signal. When the alarm signal is output from the power amplifier 22 selected, the switcher 23 selects another power amplifier 22 and supplies the amplified UHF-band OFDM signal output from the power amplifier 22 newly selected to the antenna element.

For example, when the switcher 23 has selected the power amplifier 22-2 as the active system, when the alarm signal is output from the power amplifier 22-2, the switcher 23 performs switching processing. The switching processing includes selecting the power amplifier 22-1, which is the backup system and supplying the amplified UHF-band OFDM signal output from the power amplifier 22-1 to the antenna element.

In the transmission system 1 of the present embodiment, each of the two power amplifier 22-1 and 22-2 determines whether or not the second abnormality signal is included in the UHF-band OFDM signal output from the modulation-excitation apparatus 10. Even if the amplified UHF-band OFDM signal output from the local device does not satisfy the criteria, the power amplifiers 22-1 and 22-2 do not supply the alarm signal to the switcher 23 when the second abnormality signal is detected. Even if the amplified UHF-band OFDM signal input from the power amplifiers 22-1 and 22-2 do not satisfy the criteria, by not doing switching processing when an abnormality occurs in the modulation-excitation apparatus 10, this avoids unnecessary switching by the switcher 23. Also, if the alarm signal is output from the power amplifier 22, the switcher 23 performs prompt switching regardless of the existence or non-existence of an abnormality in the modulation-excitation apparatus 10, which is an earlier-stage device, so that it is possible to shorten the time required for switching to the backup system when an abnormality is detected in the amplifying apparatus 20 that is the signal processing apparatus, thereby enabling the shortening of the time during which an OFDM signal that not satisfying the criteria is transmitted.

Also, even if in the modulation-excitation apparatus 10, in the same manner as the amplifying apparatus 20, the UHF-band OFDM signal to be output does not satisfy the criteria, when the first abnormality signal indicating the occurrence of an abnormality is detected in the earlier-stage apparatus supplying the TS signal, because the switcher 12 do not perform switching processing, unnecessary switching is avoided. If the alarm signal is output from the modulator-exciters 11, the switcher 12 performs prompt switching, regardless of existence or non-existence of an abnormality in an earlier-stage device supplying the TS signal, so that it is possible to shorten the time required for the switching to the backup system when an abnormality is detected in the modulation-excitation apparatus 10 as the signal processing apparatus, thereby enabling the shortening of the time during which an OFDM signal not satisfying the criteria is transmitted.

Figure 4:
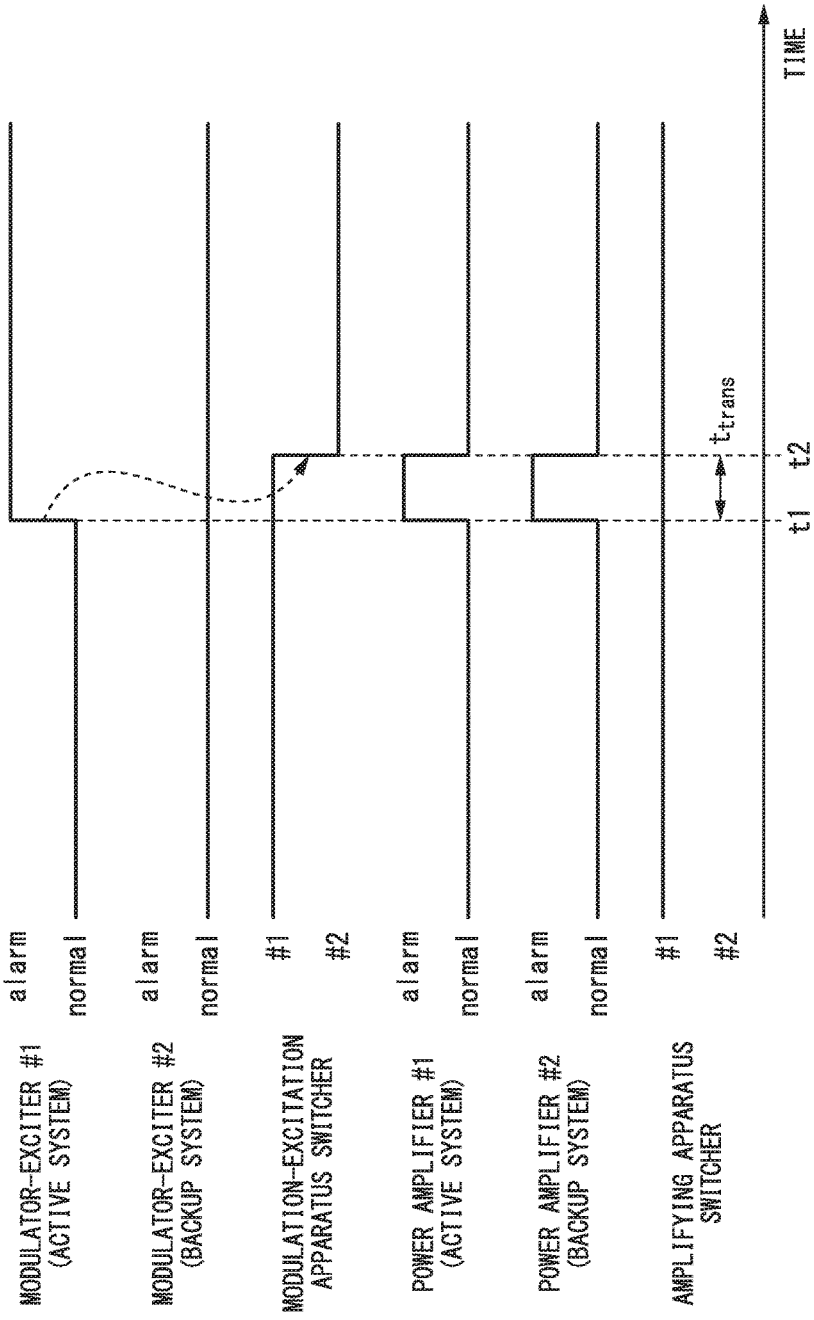
FIG. 4 is a timing diagram showing the switching processing when an abnormality occurs in an active-system modulator-exciter in the transmission system in a comparative example.

The operation of a comparison example of a transmission system having, similar to the transmission system 1 according to the present embodiment, active-system and a backup-system modulator-exciters and an amplifying apparatus will now be described. The transmission system of the comparison example determines the existence or non-existence of an abnormality in the later-stage amplifying apparatus after a waiting time required for switching in the earlier-stage modulation-excitation apparatus has elapsed and performs switching processing. FIG. 4 is a timing diagram showing the switching processing when an abnormality occurs in an active-system modulator-exciter in the transmission system in a comparative example. FIG. 4 shows the existence or non-existence (alarm/normal) of an abnormality in the active-system and backup-system modulator-exciters #1 and #2, which modulator-exciter (#1/#2) is selected by the switcher of the modulation-excitation apparatus, the existence or non-existence (alarm/normal) of an abnormality in the active-system and backup-system power amplifiers (#1/#2), and which power amplifier (#1/#2) is selected by the switcher of the amplifying apparatus.

At time t1, when an abnormality occurring in the active-system modulator-exciter #1 is detected, notification of the detected abnormality is made to the switcher of the modulation-excitation apparatus. At time t2, in response to the abnormality notification, the switcher switches from the active-system modulator-exciter #1 to the backup-system modulator-exciter #2. When this is done, from time t1 until time t2, in the power amplifier #1 and #2 included in the amplifying apparatus, the abnormality that was the cause of the abnormality occurring in the modulator-exciter #1 is detected. After time t2, by the switcher included in the modulation-excitation apparatus performing switching processing to select the modulator-exciter #2, the abnormality is no longer detected. The switching processing in the modulation-excitation apparatus requires a time of $t_{trans}(=t2-t1)$.

Figure 5:
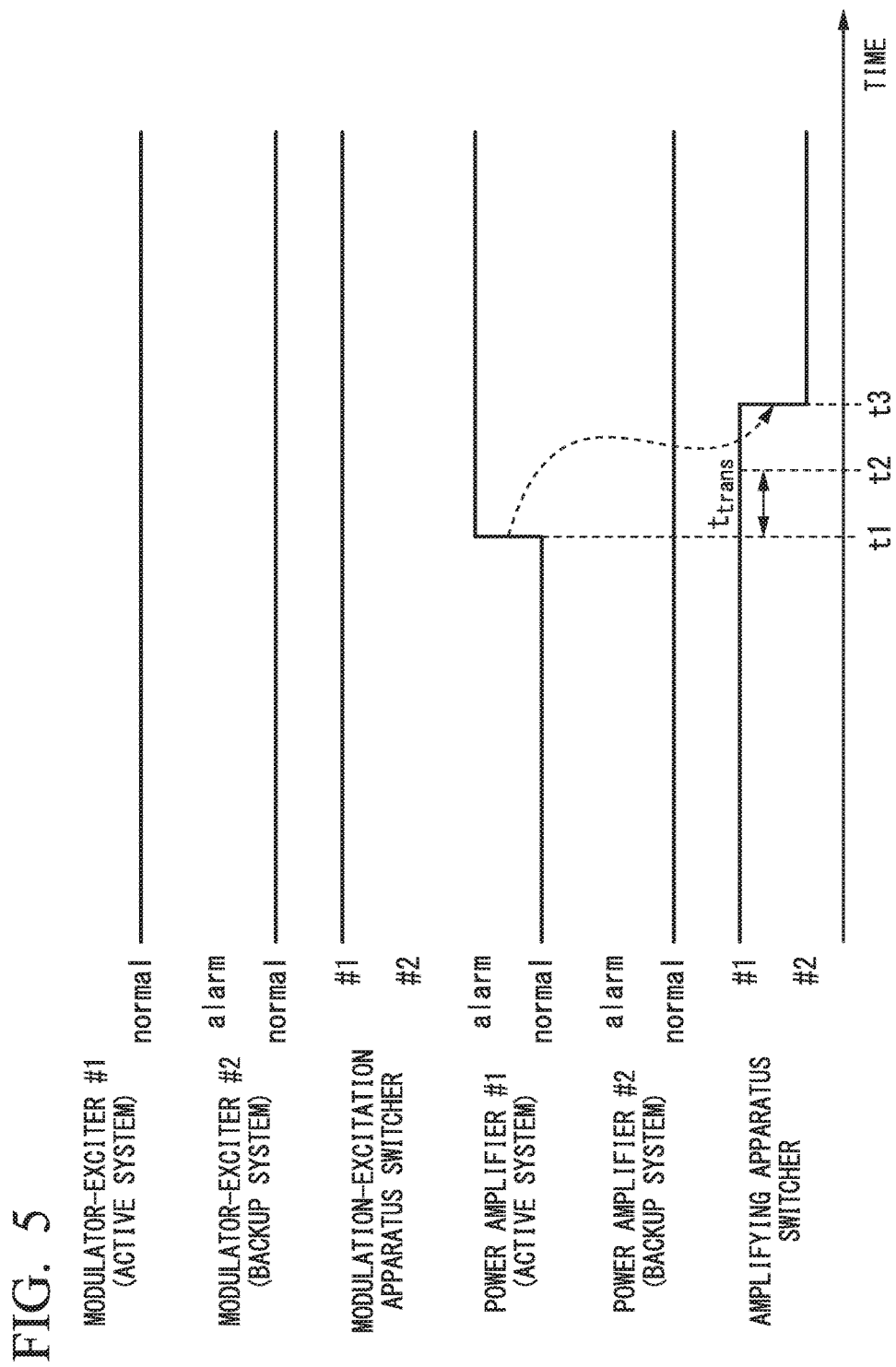
FIG. 5 is a timing diagram showing the switching processing when an abnormality occurs in an active-system power amplifier in a transmission system of the comparative example.

FIG. 5 is a timing diagram showing the switching processing when an abnormality occurs in an active-system power amplifier included in the transmission system of the comparative example. FIG. 5 shows, the same as in FIG. 4, the existence or non-existence (alarm/normal) of an abnormality in the active-system and backup-system modulator-exciters #1 and #2, which modulator-exciter (#1/#2) is selected by the switcher of the modulation-excitation apparatus, the existence or non-existence (alarm/normal) of an abnormality in the active-system and backup-system power amplifiers (#1/#2), and which power amplifier (#1/#2) is selected by the switcher of the amplifying apparatus.

At time t1, when an abnormality occurring in the active-system power amplifier #1 is detected, considering the possibility that this abnormality is an abnormality in the modulation-excitation apparatus that is the earlier-stage device, the switcher included in the amplifying apparatus waits for the elapse of the time $t_{trans}$ (waiting time), which is the time required for switching processing in the modulation-excitation apparatus. At time t2, at which the waiting time has elapsed, if the notification of an abnormality from the power amplifier #1 continues, the determination is made that the abnormality has occurred in the local device. At time t3, in response to the continuing notification of an abnormality, the switcher included in the amplifying apparatus switches from the active-system power amplifier #1 to the backup-system power amplifier #2.

Figure 6:
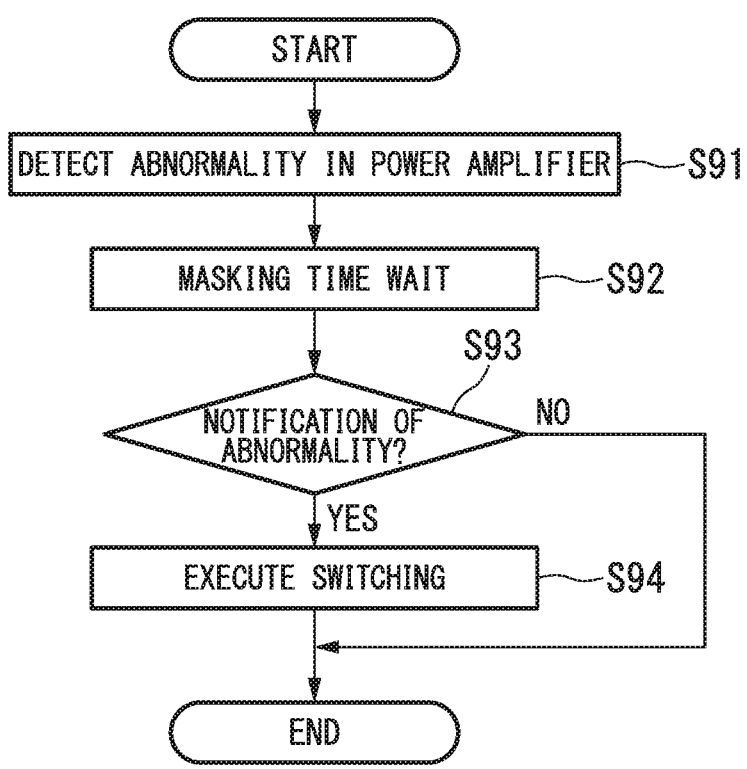
FIG. 6 is a flowchart showing the operation at the time of detection of an abnormality in the amplifying apparatus in the transmission system of the comparative example.

FIG. 6 is a flowchart showing the operation at the time of detection of an abnormality in the amplifying apparatus in the transmission system of the comparative example. When an abnormality occurring in the power amplifier #1 or #2 is detected (step S91), the amplifying apparatus masks the notification of an abnormality with a masking time that is the time required for the switching in the earlier-stage modulation-excitation apparatus (step S92). After the elapse of the masking time, the switcher determines whether or not the notification of an abnormality from the active-system power amplifier continues (step S93). If the abnormality notification continues (YES at step S93), the switcher switches to the backup-system power amplifier (step S94), and the operation is ended. If the abnormality notification does not continue (NO at step S93), the switcher determines that this is an abnormality in an earlier-stage device and the operation is ended.

In the transmission system of the comparison example, if an abnormality is detected, the later-stage device waits for a waiting time (masking time) that is the amount of time required for switching processing in the earlier-stage device, thereby avoiding wasteful switching processing. However, if an abnormality occurs in a later-stage device, the time until the switching processing becomes longer than the time until the switching processing when an abnormality occurs in an earlier-stage device, and this has led to the problem of a lengthening of the duration of the state in which an abnormality occurs.

Figure 7:
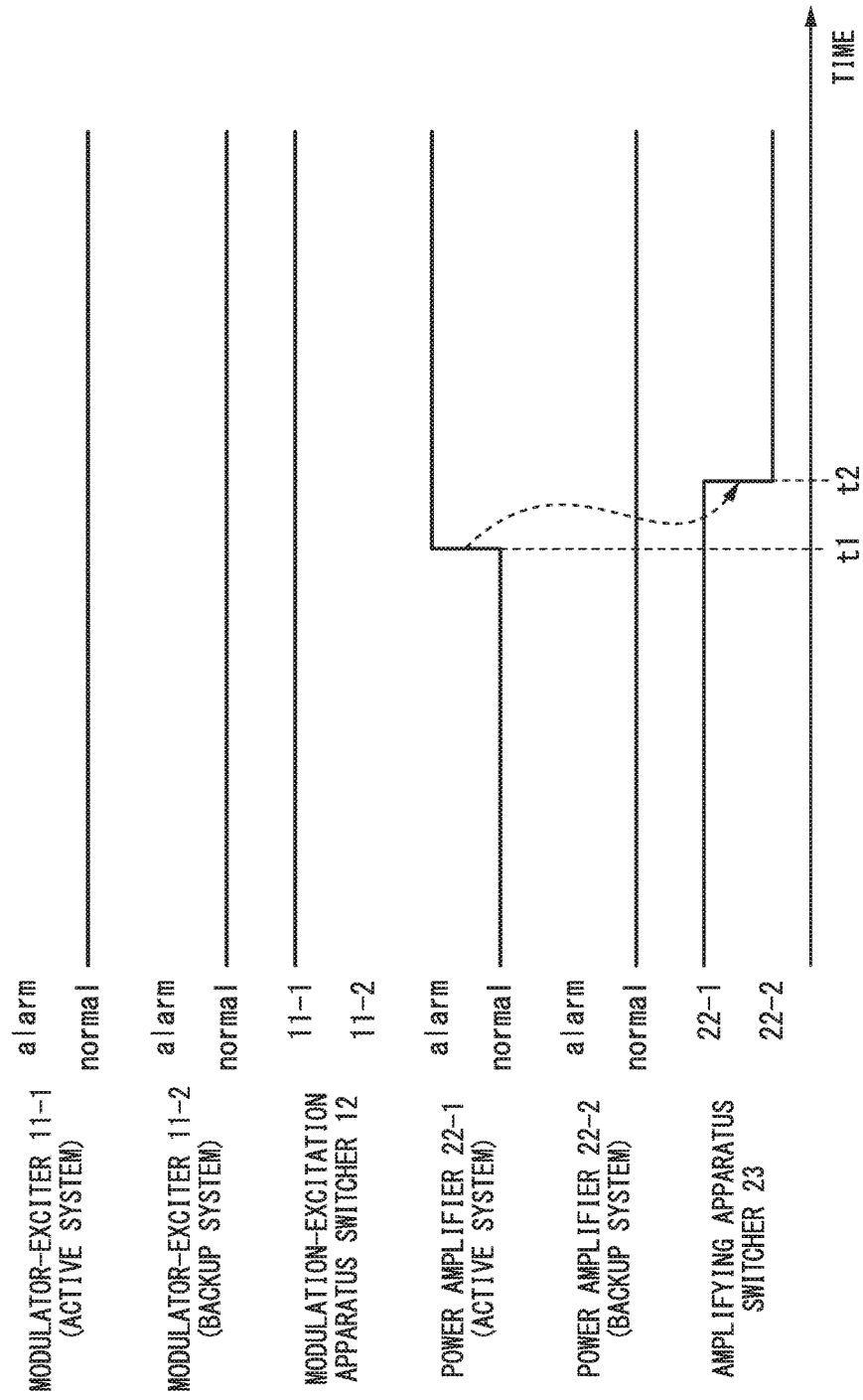
FIG. 7 is a timing diagram showing the switching processing when an abnormality occurs in an active-system power amplifier in the transmission system of the present embodiment.

FIG. 7 is a timing diagram showing the switching processing when an abnormality occurs in an active-system power amplifier 22-1 included in the transmission system 1 in the present embodiment. FIG. 7 shows the existence or non-existence (alarm/normal) of an abnormality in the active-system and backup-system modulator-exciters 11-1 and 11-2, which modulator-exciter (11-1/11-2) is selected by the switcher 12 included in the modulation-excitation apparatus 10, the existence or non-existence (alarm/normal) of an abnormality in the active-system and backup-system power amplifiers 22-1 and 22-3, and which power amplifier (22-1/22-2) is selected by the switcher 23 included in the amplifying apparatus 20.

At time t1, when an abnormality occurs in the active-system power amplifier 22-1, a determination is made of whether or not an abnormality exists in the modulation-excitation apparatus 10, which is the earlier-stage device, based on whether or not a second abnormality signal is included in the UHF-band OFDM signal. Because there is no abnormality in the earlier-stage device, the power amplifier 22-1 immediately supplies an alarm signal to the switcher 23. At time t2, in response to the alarm signal from the power amplifier 22-1, the switcher 23 performs switching processing to switch from the active-system power amplifier 22-1 to the backup-system power amplifier 22-2.

Figure 8:
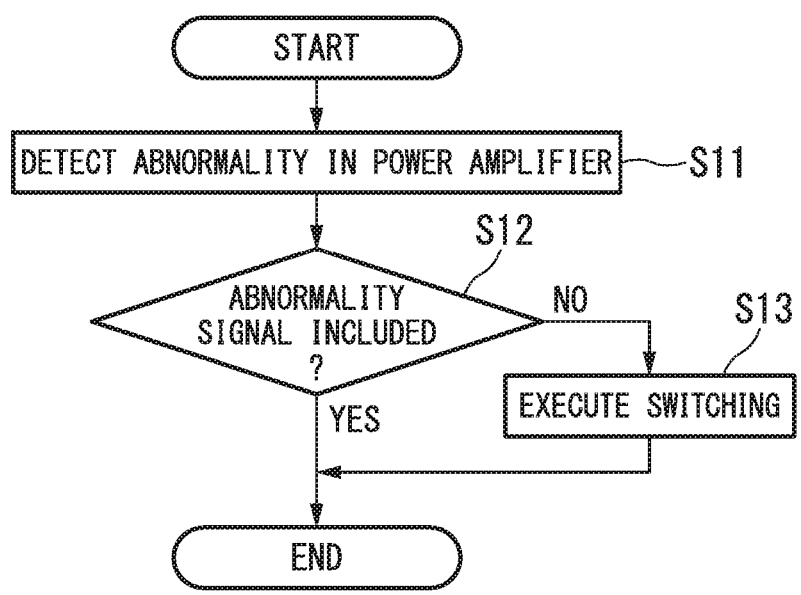
FIG. 8 is a flowchart showing the operation at the time of detection of an abnormality in the amplifying apparatus in the transmission system of the present embodiment.

FIG. 8 is a flowchart showing the operation when an abnormality is detected in the amplifying apparatus 20 included in the transmission system 1 of the present embodiment. In the amplifying apparatus 20, if an abnormality is detected in the power amplifier 22-1 or 22-2 (step S11), the amplifier 22-1 and 22-2 determines whether or not an abnormality has occurred in the earlier-stage modulation-excitation apparatus 10 based on whether or not the second abnormality signal is included in the UHF-band OFDM signal input from the earlier stage (step S12). If an abnormality has not occurred in the earlier-stage modulation-excitation apparatus 10 (NO at step S12), the switcher 23 performs switching from the power amplifier 22 currently selected to another power amplifier 22 (step S13) and ends the operation. If an abnormality has occurred in the earlier-stage modulation-excitation apparatus 10 (YES at step S12), the switcher 23 determines that the detected abnormality is causing an abnormality in the modulation-excitation apparatus 10, and the operation is ended.

In this manner, in the transmission system 1 of the present embodiment, because the existence or non-existence of an abnormality in an earlier-stage device is determined based on whether or not an abnormality signal is included in signal input from the earlier-stage device, if an abnormality occurs in a signal not satisfying the criteria obtained from the signal processing in the local device, it is possible to distinguish whether an abnormality is caused by a failure in the local device, or whether an abnormality is caused by an abnormality occurring in the earlier-stage device. By doing this, if an abnormality is caused by a failure in the local device, it is possible to perform switching processing immediately, thereby enabling a shortening of the time during which a signal not satisfying the criteria is transmitted.

In the present embodiment, the description has been for an example of a configuration in which the transmission system 1 has one amplifying apparatus 20. The transmission system, however, may have a configuration with a plurality of amplifying apparatuses 20, in which case the modulation-excitation apparatus 10 supplies a UHF-band OFDM signal to each of the plurality of amplifying apparatuses 20. In the transmission system 1, the modulation-excitation apparatus 10 and the amplifying apparatus 20 may be disposed in positions that are separated. For example, the device that generates a TS signal, such as the modulation-excitation apparatus 10, may be disposed at the performance studio, and the amplifying apparatus 20 may be disposed at a transmitting facility. In this case, optical transmission may be used for transmission of a signal between the modulation-excitation apparatus 10 and the amplifying apparatus 20. Additionally, the excitation (frequency conversion) into the UHF band may be done at the amplifying apparatus 20 side. The transmission system 1 may have, in addition to the modulation-excitation apparatus 10 and the amplifying apparatus 20, another device that is connected in series.

Also, the number of types of abnormalities indicated by the abnormality signal included in the signal output by each device may be increased, enabling to identify in which earlier-stage device an abnormality has occurred when there is a plurality of earlier-stage devices. Alternatively, in addition to the existence or non-existence of an abnormality in an earlier-stage device, the abnormality signal may be used to identify what type of abnormality has occurred. In this case, it may be made possible to identify an abnormality occurring in the local device caused by an abnormality in an earlier-stage device and an abnormality occurring in the local device not caused by an abnormality in an earlier-stage device.

For example, a table may be provided that indicates the causal relationship between an abnormality occurring in an earlier-stage device and an abnormality occurring in the local device, thereby enabling determination of whether or not there is a causal relationship between an abnormality detected in the local device and an abnormality in an earlier-stage device, when an abnormality occurs in an earlier-stage device and also an abnormality is detected in the local device. If an abnormality occurs in an earlier-stage device and also an abnormality is detected in the local device, if there is no causal relationship between these abnormalities, switching processing may be executed in the local device. This enables prompt switching processing even if abnormalities occur simultaneously in an earlier-stage device and the local device.

According to the transmission system of at least one embodiment described above, by adopting a configuration that determines whether or not a signal indicating the existence or non-existence of an abnormality in an earlier stage is included in a signal input from the earlier-stage modulation-excitation apparatus, if an abnormality is detected in which the output signal of a power amplifier does not satisfy a prescribed criteria, it is possible to distinguish between an abnormality caused by an earlier-stage modulation-excitation apparatus and an abnormality in an amplifying apparatus, thereby enabling a shortening of the time required for switching when an abnormality is detected in an amplifying apparatus.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A transmission system comprising:
a plurality of signal processing apparatuses connected in series, in which the signal processing apparatus including:
a plurality of signal processors, each of the plurality of signal processors generating an output signal by performing signal processing of an input signal from an earlier-stage signal processing apparatus, each of the plurality of signal processors supplying the output signal if an abnormality signal indicating that criteria in the earlier-stage signal processing apparatus is not satisfied is included in the input signal or if the abnormality signal is not included in the input signal and also the output signal satisfies the criteria in a local device, and each of the plurality of signal processors supplying the output signal into which is included an abnormality signal if the abnormality signal is not included in the input signal and also the output signal does not satisfy the criteria; and
a switcher that receives a plurality of output signals output from the plurality of signal processors, that supplies an output signal of the plurality of output signals if the output signal for a later-stage signal processing apparatus satisfies the criteria and if the abnormality signal is included in the input signal, and that supplies another output signal of the plurality of output signals if the output signal for the later-stage signal processing apparatus does not satisfy the criteria and also the abnormality signal is not included in the input signal.

2. A transmission system comprising:
a first modulator-exciter that modulates a signal to a first modulated signal conforming to a standard for transmission, that determines whether or not the first modulated signal satisfies first criteria, that supplies the first modulated signal if the first modulated signal satisfies the first criteria, that incorporates an abnormality signal indicating a detection of an abnormality into the first modulated signal if the first modulated signal does not satisfy the first criteria, and that supplies the first modulated signal, into which the abnormality signal is incorporated, if the first modulated signal does not satisfy the first criteria;
a second modulator-exciter that modulates the signal to a second modulated signal conforming to the standard, that determines whether or not the second modulated signal satisfies the first criteria, that supplies the second modulated signal if the second modulated signal satisfies the first criteria, that incorporates the abnormality signal into the second modulated signal if the second modulated signal does not satisfy the first criteria, and that supplies the second modulated signal, into which the abnormality signal is incorporated, if the second modulated signal does not satisfy the first criteria;
a first switcher that receives the first modulated signal output from the first modulator-exciter and the second modulated signal output from the second modulator-exciter, that supplies a first output signal of the first and second modulated signals if the first switcher did not detect the abnormality signal in the first output signal, and that supplies another first output signal of the first and second modulated signals if the first switcher detected the abnormality signal in the first output signal;
a first power amplifier that amplifies the first output signal, output from the first switcher, to generate a first amplified signal, that supplies the first amplified signal if the abnormality signal is detected in the first output signal or if the abnormality signal is not detected in the first output signal and also the first amplified signal satisfies second criteria, that incorporates the abnormality signal into the first amplified signal if the abnormality signal is not detected in the first output signal and also the first amplified signal does not satisfy the second criteria, and that supplies the first amplified signal, into which the abnormality signal is incorporated, if the abnormality signal is not detected in the first output signal and also the first amplified signal does not satisfy the second criteria;

a second power amplifier that amplifies the first output signal, output from the first switcher, to generate a second amplified signal, that supplies the second amplified signal if the abnormality signal is detected in the first output signal or if the abnormality signal is not detected in the first output signal and also the second amplified signal satisfies the second criteria, that incorporates the abnormality signal into the second amplified signal if the abnormality signal is not detected in the first output signal and also the second amplified signal does not satisfy the second criteria, and that supplies the second amplified signal, into which the abnormality signal is incorporated, if the abnormality signal is not detected in the first output signal and also the second amplified signal does not satisfy the second criteria; and a second switcher that receives the first amplified signal output from the first power amplifier and the second amplified signal output from the second power amplifier, that supplies a second output signal of the first and second amplified signals if the second switcher did not detect the abnormality signal in the second output signal, and that supplies another second output of the first and second amplified signals if the second switcher detected the abnormality signal in the second output signal.

* * * * *